United States Patent [19]
Loo et al.

[11] Patent Number: 5,245,340
[45] Date of Patent: Sep. 14, 1993

[54] DIGITAL TRANSMULTIPLEXER WITH AUTOMATIC THRESHOLD CONTROLLER

[75] Inventors: Chun Loo, Ontario, Canada; Masahiro Umehira, Yokohama, Japan

[73] Assignee: Her Majesty the Queen in right of Canada, as represented by the Minister of Communications, Nepean, Canada

[21] Appl. No.: 835,356

[22] Filed: Feb. 14, 1992

Related U.S. Application Data

[63] Continuation-in-part of Ser. No. 540,771, Jun. 20, 1990, abandoned.

[30] Foreign Application Priority Data

Jun. 27, 1989 [CA] Canada ................................. 604115

[51] Int. Cl.$^5$ .............................................. H03M 1/06
[52] U.S. Cl. .................................. 341/118; 341/158
[58] Field of Search ............... 341/118, 119, 120, 121, 341/155, 158, 164, 165

[56] References Cited

U.S. PATENT DOCUMENTS

| | | | |
|---|---|---|---|
| 3,366,948 | 1/1968 | Price | 341/118 |
| 3,893,103 | 7/1975 | Prill | 341/118 |
| 3,930,256 | 12/1975 | Amemiya | 341/118 |
| 3,953,805 | 4/1976 | Couvillon | 341/118 X |
| 4,097,860 | 6/1978 | Araseki et al. | 341/118 |
| 4,380,005 | 4/1983 | Debord et al. | 341/118 |
| 4,449,102 | 5/1984 | Frazer | 328/162 |
| 4,468,651 | 8/1984 | Lechner et al. | 341/118 |
| 4,524,346 | 6/1985 | Bosserhoff et al. | 341/118 |
| 4,549,165 | 10/1985 | Brian | 341/118 |
| 4,602,374 | 7/1986 | Nakamura et al. | 341/118 X |
| 4,648,100 | 3/1987 | Mardirosian | 375/86 |
| 4,771,267 | 9/1988 | Russell, Jr. et al. | 341/118 |
| 4,805,192 | 2/1989 | Confalonieri | 341/118 X |

Primary Examiner—Howard L. Williams
Attorney, Agent, or Firm—Pascal & Associates

[57] ABSTRACT

A group demodulator for FDMA/PSK input signals comprising a down-converter for the input signals to convert these signals into in-phase and quadrature-related signals which are applied through analog-to-digital converters to a digital transmultiplexer. The digital transmultiplexer converts the signals into a number of channels of PSK modulated data. The output of each analog-to-digital converter is applied to an automatic threshold controller which detects the statistical bias of the input signal amplitude. Each automatic threshold controller provides an analog reference signal which is applied to a reference input of the associated analog-to-digital converter. The reference signal corrects any DC offset error for the analog-to-digital converter and prevents degradation in energy per bit-to-noise density ratio.

4 Claims, 1 Drawing Sheet a continuation-in-part of U.S. Ser. No. 540,771
filed Jun. 20th, 1990, now abandoned.

DIGITAL TRANSMULTIPLEXER WITH AUTOMATIC THRESHOLD CONTROLLER

This is a continuation-in-part of U.S. Ser. No. 540,771 filed Jun. 20th, 1990, now abandoned.

FIELD OF THE INVENTION

The present invention relates generally to a communication system in which a frequency-division multiple access (FDMA) signal having multiple phase-shift-keying (PSK) data channels are processed in a group of demodulators en bloc, the analog FDMA/PSK signal being converted into digital form prior to being applied to a digital transmultiplexer.

BACKGROUND OF THE INVENTION

U.S. Pat. No. 4,785,447 describes one type of transmultiplexer for a N-channel FDM signal wherein; for demodulating that signal, quadrature versions of a carrier are supplied from a local oscillator and a p/2 phase shifter to two mixers to produce complex signals. These complex signals are then applied through low-pass filters to analog-to-digital converters for conversions into digital form before being fed to a switching circuit. Another type of demodulating device is described in U.S. Pat. No. 4,754,449 which transforms NFDMA channels of PSK signals into a single time division multiplex (TDM) channel of PSK data. A single demodulator demodulates the single TDM channel before it is fed to a demultiplexer.

U.S. Pat. No. 4,648,100 descries a demodulation device for a single 64QAM signal in which modulated IF quadrature-related carriers are applied two demodulators. A local oscillator applies a signal, directly and through a p/2 phase shifter, to the demodulators to form two digital data channels. In a phase detector, signals from the in-phase and quadrature rails are applied to analog-to-digital converters which are also supplied with threshold adjust signals obtained from the data detector circuitry. The analog-to-digital converters in the U.S. Patent are part of a phase detector circuit which provides a phase error signal. The value and polarity of the phase error signal align the receiver-generated carriers from the local oscillator and p/2 phase shifter to the quadrature-related carriers in the input signal. This patent along with the previously mentioned patents serve to illustrate several different types of communication systems and apparatus for processing signals in these types of communication systems.

SUMMARY OF THE INVENTION

It is an object of the present invention to increase the number of channels in a group demodulator for FDMA/PSK signals without significant degradation in bit error rate performance.

It is a further object of the invention to reduce the number of bits per channel used by A/D converters for signals before they are applied to a digital transmultiplexer in a group demodulator.

It is still a further object of the invention to sense any DC offset of A/D conversion in a group demodulator and to correct this DC offset error.

In accordance with the present invention, a group demodulator for FDMA/PSK intermediate frequency (IF) signals comprises a down-converter for converting the signals into in-phase and quadrature-related analog signals which are applied through analog-to-digital converters to a digital transmultiplexer, the transmultiplexer converting the signals into a number of channels of PSK modulated data; wherein the output of each analog-to-digital converter is applied to an automatic threshold controller, each automatic threshold controlling detecting the statistical bias of the input signal amplitude, each automatic threshold controller providing an output analog reference signal which is applied to a reference input of the associated analog-to-digital converter, the reference signal correcting any DC offset error for that analog-to-digital converter.

In a preferred embodiment, an intermediate frequency signal is split into two by a hybrid. One of the signals together with the local oscillator output is applied directly to a mixer in the down-converter and the other signal along with the local oscillator signal through a p/2 phase shifter is applied to a second mixer in the down-converter, the mixer's outputs being applied through low-pass filters to said analog-to-digital converters.

In a further preferred embodiment, each automatic threshold controller comprises a DC offset detector $\geq m$ and a DC offset detector $\leq -m$ for digital output signals from the associated analog-to-digital converter, the output of the detectors being applied through a digital sequential filter to a digital integrator to obtain a sampled reference voltage which is applied to a digital-to-analog converter whose output provides said reference signal.

BRIEF DESCRIPTION OF THE DRAWINGS

The present invention will now be described in more detail with reference to the accompanying drawings, wherein.

DETAILED DESCRIPTION OF A PREFERRED EMBODIMENT

Figure 1:
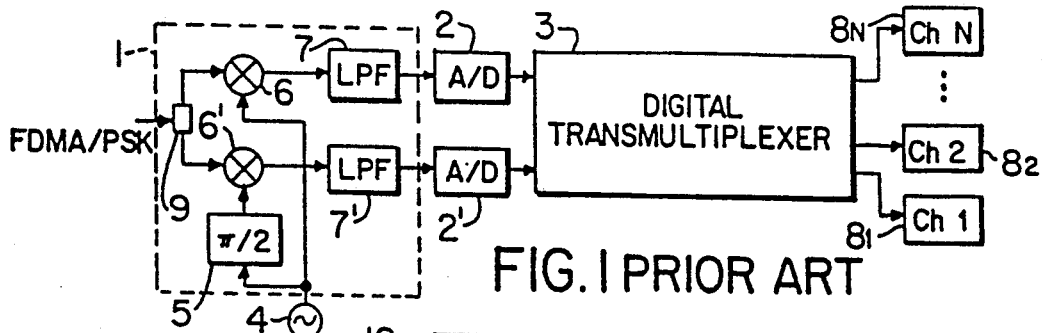
FIG. 1 is a circuit diagram of a conventional group demodulator for FDMA/PSK signals.

A conventional group demodulation system for FDMA/PSK signals is shown in FIG. 1 and comprises down-converter 1 for an intermediate frequency FDMA/PSK input signal. A signal from a local oscillator 4 is applied directly to a mixer 6 and through a $\pi/2$ phase shifter 5 to mixer 6' in down-converter 1. The intermediate frequency FDMA/PSK input signal is split into two by hybrid 9, the two signals being applied to the other input of mixers 6 and 6' whose outputs provide in-phase and quadrature related FDMA/PSK signals which are applied through low pass filters 7 and 7' to analog-to-digital (A/D) converters 2 and 2' respectively. The FDMA/PSK signals from filters 7 and 7' are digitized in A/D converters 2 and 2' before being applied to a digital transmultiplexer 3 where they are converted into a PSK signal for each of the channels $8_1$ to $8_N$.

Figure 4:
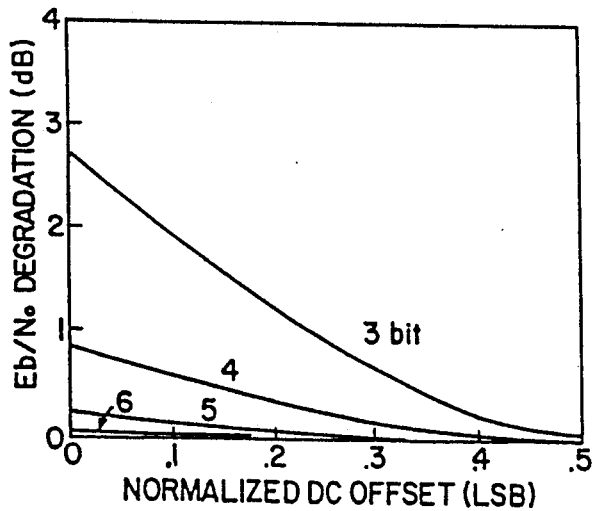
FIG. 4 shows graphs which illustrate the degradation in energy per bit-to-noise density ratio (Eb/No) for an analog-to-digital converter with changes in D.C. offset as the number of bits used for quantizing a data channel is altered.

In conventional A/D converters, such as a 12 bit A/D converter, 6 bits may be allocated to quantize a data channel in order to keep the quantization noise at a suitable level below the signal strength. A small number of bits is not used since the sampled data signal is increasingly sensitive to DC offset when the number bits allocated for quantizing a channel is reduced. This is illustrated in FIG. 4 with graphs that show the degradation in energy per bit-to-noise density ratio (Eb/No) for A/D converters when 6 bits are used as well as when 5, 4 or 3 bits are used. The Eb/No ratio degrades drastically with reduction of bits for small values of DC offset. Therefore, more bits than are theoretically required for A/D conversion are used to keep the bit error rate performance at an acceptable level. However, the number of possible channels in a group can be increased by reducing the number of bits allocated for quantizing a channel. A system, according to the present invention, for reducing the number of bits per channel without degrading the bit error rate performance is shown in FIG. 2.

Figure 2:
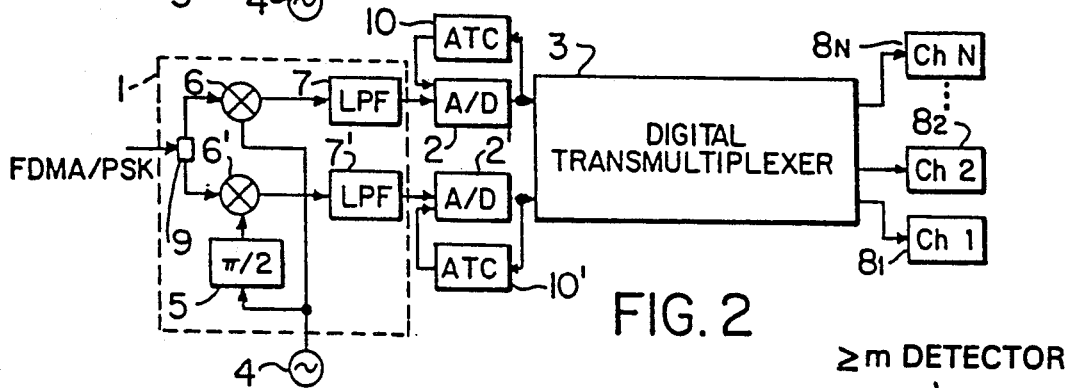
FIG. 2 is a circuit diagram of a group demodulator according to the present invention.

In accordance with an embodiment of the invention, a method of reducing the bit error rate for A/D converters is to correct the DC offset and maintain it nearly at 0 which can be accomplished with an automatic threshold controller (ATC) as shown in FIG. 2. The operating principle of the ATC is based on detecting the statistical bias of the input signal amplitude. Since the input signal consists of multiple FDMA/PSK signals, the composite signal approaches a Gaussian distribution according to the Central Limit Theorem. Thus, the probability of the input amplitude of the composite signal being $\geq 0$ is equal to the probability of the input amplitude being $\leq 0$. The ATC makes use of this feature of the input signal.

Figure 3:
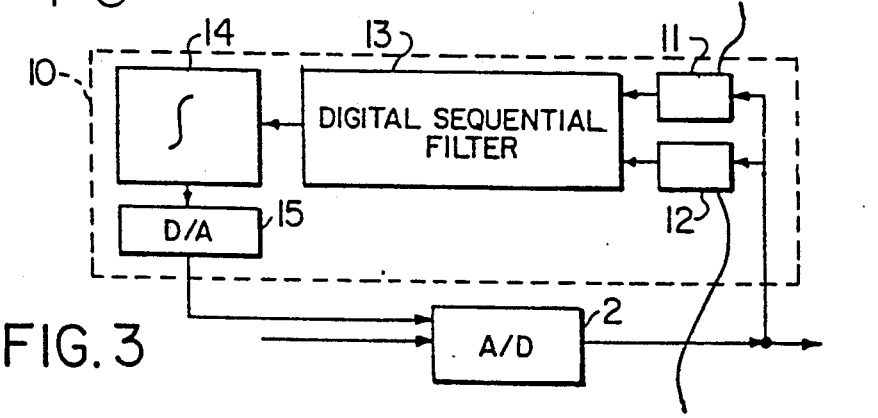
FIG. 3 is a circuit diagram of an automatic threshold controller shown in FIG. 2.

The automatic threshold controllers 10 and 10' receive the digitized output of A/D converters 2 and 2' respectively. If DC offset is biased in either way, the polarity of the DC offset can be detected by the DC offset detector 11 ($\geq m$) and DEC offset detector 12 ($\leq -m$), where m is the input signal amplitude and threshold for the ATC (FIG. 3). One can set $m=1$ for a stable point. Then, the input amplitude polarity is smoothed for a certain period by the digital sequential filter 13 before averaging by the digital integrator 14 to obtain a sampled reference voltage. This sampled reference voltage is converted to an analog reference signal by a D/A converter and applied to a reference input of the associated A/D converter. That reference signal is used as a reference voltage for the associated A/D converter and corrects the DC offset error.

All the incoming bits from A/D converter 2 to ATC10 are used by the DC offset detectors 11 ($\geq m$) and 12 ($\leq -m$) respectively as illustrated in FIG. 3. The transfer characteristic of the DC offset detector $\leq m$ approximates complementary error function as $$DC \text{ offset detection } 11(\geq m) \text{ output} = \frac{1}{2} \, erfc\left(\frac{(m - DC)\Delta}{\sqrt{2}\sigma}\right)$$

where $\Delta$ is the amplitude of the least significant bit (LSB) and $v^2$ is the power of the input signal. DC is the DC level setting. For example $DC=0.5$ when $M=1$. Also, the transfer characteristic of the DC offset detector $\leq -m$ approximates an error function as $$DC \text{ offset detector } 12(\leq -m) \text{ output} =$$

$$\frac{1}{2} \, erf\left(\frac{(1 - m + DC)\Delta}{\sqrt{2}\sigma}\right)$$

The outputs of 11 and 12 are smoothed by a digital sequential filter 13 and digitally integrated in digital integrator 14 to obtain a sampled reference signal. This sampled reference signal is applied to D/A converter 15 where it is converted to an analog reference voltage which is applied to a reference input of A/D converter 2 in order to correct any DC offset. ATC circuit 10' operates in the same manner with A/D converter 2'.

The circuitry shown in FIG. 2 allows an A/D converter to allocate only 4 bits for quantizing a data channel instead of 6 bits for the previously described conventional A/D converter. This results in a 4-fold increase in the number of FDMA/PSK channels that can be handled by a group demodulator.

Various modifications may be made to the preferred embodiment without departing from the spirit and scope of the invention as defined in the appended claims.

We claim:

1. A group demodulator for an FDMA/PSK intermediate frequency input signal, comprising a downconverter for the input signal for converting that signal into in-phase and quadrature-related FDMA/PSK signals, means for applying the in-phase signal through a first analog-to-digital converter to a digital transmultiplexer and the quadrature-related signal through a second analog-to-digital converter to the digital transmultiplexer, the transmultiplexer converting digitized signals from the first and second analog-to-digital converters into a number of channels of PSK demodulated data, the digital output of each analog-to-digital converter being quantized by each analog-to-digital converter with fewer bits per channel than the number of bits otherwise required to achieve a predetermined energy per bit-to-noise ratio, said fewer bits being applied to an associated automatic threshold controller, each automatic threshold controller detecting the statistical bias of the input signal amplitude, each automatic threshold controller providing an output analog reference signal which is applied to a reference input of the associated analog-to-digital converter, the reference signal correcting DC offset error for that analog-to-digital converter, whereby an output signal per channel having said predetermined energy per bit-to-noise-ratio is achieved.

2. A group demodulator as defined in claim 1, wherein an intermediate frequency generated by a local oscillator is applied directly to a first mixer in the downconverter and through a $\pi/2$ phase shifter to a second mixer in the down converter, the first and second mixer whose outputs provide the in-phase and the quadrature-related signals, which signals are applied through lowpass filters to the first and second analog-to-digital converter respectively.

3. A group demodulator as defined in claim 1, wherein each automatic threshold controller includes a DC offset detector $\geq m$ and a DC offset detector $\leq -m$ for digital output signals from the associated analog-to-digital converter, the digital output from the associated analog-to-digital converter being applied to the detectors whose outputs are applied through a digital sequential filter to a digital integrator to obtain a sampled reference voltage which is applied to a digital-to-analog converter whose output provides said reference signal.

4. A group demodulator as defined in claim 2, wherein each automatic threshold controller includes a DC offset detector $\geqq m$ and a DC offset detector $\leqq -m$ for incoming bits from the associated analog-to-digital converter, outputs from the detectors being applied through a digital sequential filter to a digital integrator which provides a sampled reference voltage, the sampled reference voltage being applied to a digital-to-analog converter whose output provides said reference signal.

* * * * *

UNITED STATES PATENT AND TRADEMARK OFFICE
CERTIFICATE OF CORRECTION

PATENT NO. : 5,245,340
DATED : September 14, 1993
INVENTOR(S) : Chun Loo, Masahiro Umehira It is certified that error appears in the above-identified patent and that said Letters Patent is hereby corrected as shown below:

Column 4, line 56, after "converter," insert

--the input signal being applied to second inputs of--

Column 3, line 62, delete "$v^2$" and insert -- $\sigma^2$ --

Signed and Sealed this

Seventeenth Day of September, 1996

Attest:

BRUCE LEHMAN

*Attesting Officer*  *Commissioner of Patents and Trademarks*